US010855053B2

(12) United States Patent
Flanders et al.

(10) Patent No.: US 10,855,053 B2
(45) Date of Patent: Dec. 1, 2020

(54) OCT SYSTEM WITH BONDED MEMS TUNABLE MIRROR VCSEL SWEPT SOURCE

(71) Applicant: Axsun Technologies, Inc., Billerica, MA (US)

(72) Inventors: Dale C. Flanders, Lexington, MA (US); Mark E. Kuznetsov, Lexington, MA (US); Walid A. Atia, Lexington, MA (US); Bartley C. Johnson, North Andover, MA (US)

(73) Assignee: Axsun Technologies, Inc., Billerica, MA (US)

( * ) Notice: Subject to any disclaimer, the term of this patent is extended or adjusted under 35 U.S.C. 154(b) by 69 days.

(21) Appl. No.: 16/129,856

(22) Filed: Sep. 13, 2018

(65) Prior Publication Data
US 2019/0027895 A1    Jan. 24, 2019

Related U.S. Application Data

(62) Division of application No. 15/217,124, filed on Jul. 22, 2016, now Pat. No. 10,109,979, which is a
(Continued)

(51) Int. Cl.
*H01S 5/068* (2006.01)
*H01L 33/00* (2010.01)
(Continued)

(52) U.S. Cl.
CPC .......... *H01S 5/068* (2013.01); *G01B 9/02004* (2013.01); *G01B 9/02091* (2013.01);
(Continued)

(58) Field of Classification Search
None
See application file for complete search history.

(56) References Cited

U.S. PATENT DOCUMENTS

| 5,608,519 A | * | 3/1997 | Gourley | ................. G01N 15/10 250/461.2 |
| 5,742,720 A | | 4/1998 | Kobayashi et al. | |

(Continued)

FOREIGN PATENT DOCUMENTS

| JP | 04-148578 | 5/1992 |
| JP | 05-224251 | 9/1992 |

(Continued)

OTHER PUBLICATIONS

Annual Report 2000, Optoelectronics Department, University of Ulm, Jan. 2001. One hundred thirty-two pages.

(Continued)

*Primary Examiner* — Shawn Decenzo
(74) *Attorney, Agent, or Firm* — HoustonHogle LLP

(57) ABSTRACT

A microelectromechanical systems (MEMS)-tunable vertical-cavity surface-emitting laser (VCSEL) in which the MEMS mirror is bonded to the active region. This allows for a separate electrostatic cavity that is outside the laser's optical resonant cavity. Moreover, the use of this cavity configuration allows the MEMS mirror to be tuned by pulling the mirror away from the active region. This reduces the risk of snap down. Moreover, since the MEMS mirror is now bonded to the active region, much wider latitude is available in the technologies that are used to fabricate the MEMS mirror. This is preferably deployed as a swept source in an optical coherence tomography (OCT) system.

17 Claims, 10 Drawing Sheets

Related U.S. Application Data division of application No. 13/723,829, filed on Dec. 21, 2012, now abandoned.

(51) Int. Cl.

| | |
|---|---|
| G01B 9/02 | (2006.01) |
| H01S 5/06 | (2006.01) |
| H01S 5/022 | (2006.01) |
| H01S 5/024 | (2006.01) |
| H01S 5/04 | (2006.01) |
| H01S 5/183 | (2006.01) |

(52) U.S. Cl.
CPC ........ *H01L 33/005* (2013.01); *H01S 5/02284* (2013.01); *H01S 5/02288* (2013.01); *H01S 5/02415* (2013.01); *H01S 5/041* (2013.01); *H01S 5/06* (2013.01); *H01S 5/183* (2013.01); *H01S 5/18366* (2013.01); *H01S 5/0222* (2013.01); *H01S 5/02204* (2013.01); *H01S 5/02216* (2013.01); *H01S 5/02224* (2013.01); *H01S 5/18305* (2013.01); *H01S 5/18341* (2013.01); *H01S 5/18358* (2013.01); *H01S 5/18375* (2013.01)

(56) References Cited

U.S. PATENT DOCUMENTS

| | | | |
|---|---|---|---|
| 5,778,018 | A | 7/1998 | Yoshikawa et al. |
| 5,995,531 | A | 11/1999 | Gaw et al. |
| 6,661,830 | B1 | 12/2003 | Reed et al. |
| 6,768,756 | B2 | 7/2004 | Flanders et al. |
| 6,785,317 | B2 | 8/2004 | Panajotov et al. |
| 6,804,270 | B1 | 10/2004 | Vakhshoori et al. |
| 6,879,442 | B2 | 4/2005 | Pezeshki |
| 6,940,885 | B1 | 9/2005 | Cheng et al. |
| 6,963,598 | B1 | 11/2005 | Guenter et al. |
| 6,970,488 | B2 | 11/2005 | Spoonhower et al. |
| 7,244,629 | B2 | 7/2007 | Ezaki et al. |
| 7,327,772 | B2 | 2/2008 | Kuznetsov |
| 7,415,049 | B2 | 8/2008 | Flanders et al. |
| 7,416,674 | B2 | 8/2008 | Coppeta |
| 7,468,997 | B2 * | 12/2008 | Jayaraman ............. A61B 3/102 372/20 |
| 8,059,277 | B2 | 11/2011 | Atia et al. |
| 8,189,642 | B1 | 5/2012 | Li et al. |
| 2002/0126726 | A1* | 9/2002 | Flanders ............. G02B 5/1828 372/107 |
| 2002/0168136 | A1 | 11/2002 | Atia et al. |
| 2003/0026313 | A1 | 2/2003 | Morelli et al. |
| 2003/0043868 | A1 | 3/2003 | Stewart et al. |
| 2004/0032646 | A1* | 2/2004 | Koren ................... H01S 5/5018 359/344 |
| 2004/0076198 | A1 | 4/2004 | Spoonhower et al. |
| 2006/0187997 | A1 | 8/2006 | Ezaki et al. |
| 2007/0030873 | A1 | 2/2007 | Deng |
| 2007/0104241 | A1 | 5/2007 | Kim et al. |
| 2007/0183643 | A1* | 8/2007 | Jayaraman ............. A61B 3/102 382/131 |
| 2008/0317201 | A1 | 12/2008 | Hogan |
| 2009/0232170 | A1 | 9/2009 | Schwarz et al. |
| 2009/0284749 | A1 | 11/2009 | Johnson et al. |
| 2009/0290167 | A1 | 11/2009 | Flanders et al. |
| 2010/0091804 | A1 | 4/2010 | Musio et al. |
| 2010/0322624 | A1 | 12/2010 | Liu et al. |
| 2011/0051143 | A1 | 3/2011 | Flanders et al. |
| 2011/0051148 | A1 | 3/2011 | Flanders et al. |
| 2011/0080591 | A1 | 4/2011 | Johnson et al. |
| 2011/0157552 | A1 | 6/2011 | Bublitz et al. |
| 2011/0255095 | A1 | 10/2011 | Jiang et al. |
| 2012/0162659 | A1 | 6/2012 | Goldberg et al. |
| 2012/0162662 | A1 | 6/2012 | Johnson et al. |
| 2012/0257210 | A1 | 10/2012 | Whitney et al. |

FOREIGN PATENT DOCUMENTS

| | | |
|---|---|---|
| JP | 2002/057395 | 2/2002 |
| JP | 2004/140371 | 5/2004 |
| JP | 2007/134698 | 5/2007 |
| JP | 2007-194597 | 8/2007 |
| JP | 2007/278868 | 10/2007 |
| JP | 2011/243599 | 12/2011 |
| KR | 10-2007-0058246 | 6/2007 |

OTHER PUBLICATIONS

Chase, C., et al, "1550 nm high contrast grating VCSEL," Optics Express, vol. 18, No. 15, Jul. 19, 2010, pp. 15461-15466.

Grulkowski, I., et al., "Retinal, anterior segment and full eye imaging using ultrahigh speed swept source OCT with vertical-cavity surface emitting lasers," Biomedical Optics Express, vol. 3, No. 11, Nov. 1, 2012, pp. 2733-2751.

International Preliminary Report on Patentability, dated Jul. 2, 2015, from counterpart International Application No. PCT/US2013/076866, filed on Dec. 20, 2013.

International Search Report and Written Opinion of the International Searching Authority, dated May 14, 2014, from counterpart International Application No. PCT/US2013/076866, filed Dec. 20, 2013.

Jayaraman, V., et al., "Design and performance of broadly tunable, narrow line-width, high repetition rate 1310nm VCELs for swept source optical coherence tomography," Proc. of SPIE, vol. 8276, © 2012, downloaded from SPIE Digital Library on Feb. 15, 2012, pp. 82760D-1 to 82760D-11.

Jayaraman, V., et al., "High-sweep-rate 1310 nm MEMS-VCSEL with 150 nm continuous tuning range," Electronics Letters, vol. 48, No. 14, Jul. 5, 2012, 2 pages.

Jayaraman, V., et al., "Rapidly swept, ultra-widely-tunable 1060 nm MEMS-VCSELs," © The Institution of Engineering and Technology 2012, Sep. 6, 2012, 2 pages.

Jayaraman, V., et al., "Tunable lasers: 760 kHz OCT scanning possible with MEMS-tunable VCSEL," published in LaserFocusWorld, Jul. 2011, from 2011 Conf. on Lasers and Electro Optics (CLEO), postdeadline paper PDPB2, Baltimore, MD, May 2011, 2 pages.

Kanbara, N., et al., "High speed micromechanically tunable Surface Emitting Laser with Si-MEMS technology," Photonics Technology, Yokogawa Technical Report English Edition No. 47 (2009). 4 pages.

Kanbara, N., et al., "MEMS Tunable VCSEL with Concave Mirror using the Selective Polishing Method," 0-7803-9562-X/06, IEEE 2006. 2 pages.

Keeler, G., et al., "VCSEL Polarization Control for Chip-Scale Atomic Clocks," Sandia Report, SAND2007-0069, Printed Jan. 2007, pp. 1-15.

Matsui, Yasuhiro, et al., "Complete Polarization Mode Control of Long-Wavelength Tunable Vertical-Cavity Surface-Emitting Lasers Over 65-nm Tuning, Up to 14-mW Output Power," IEEE Journal of Quantum Electronics, vol. 39, No. 9, Sep. 2003.

New Focus, Inc. "Polarization and Polarization Control," 1993, 8 pages.

Nishiyama, "Long-Wavelength Vertical-Cavity Surface-Emitting Lasers on InP with Lattice Matched AlGaInAs-InP DBR Grown by MOCVD" Sep. 2005, IEEE J sel topics Quantum electron. vol. 11, No. 5, 990-998.

Reidl, Michael, et al., "Approaches for Polarization Control in VCSELs," Annual Report 2000, Optoelectronics Department, University of Ulm, Jan. 2001, pp. 21-26.

Strijbos, Remco C., et al, "Intra-cavity Contacted VCSELs with Polarization Control," Proc. SPIE 3946, Vertical-Cavity Surface-Emitting Lasers IV, 69 (May 1, 2000); doi:10.1117/12.384362, 9 pages.

Vakhshoori, D., et al., "2mW CW singlemode operation of a tunable 1550nm vertical cavity surface emitting laser with 50nm tuning range," Electronics Letters, Vol. 35, No. 11, May 27, 1999, pp. 900-901.

Yano, Tetsuo, et al. "Wavelength Modulation Over 500 kHz of Micromechanically Tunable InP-Based VCSELs With Si-MEMS

(56) References Cited

OTHER PUBLICATIONS

Technology." IEEE Journal of Selected Topics in Quantum Electronics, vol. 15, No. 3, May/Jun. 2009, p. 528-534.

* cited by examiner

OCT SYSTEM WITH BONDED MEMS TUNABLE MIRROR VCSEL SWEPT SOURCE

RELATED APPLICATIONS

This application is a Divisional of U.S. application Ser. No. 15/217,124, filed on Jul. 22, 2016, which is a Divisional of U.S. application Ser. No. 13/723,829, filed on Dec. 21, 2012, both of which are incorporated herein by reference in their entirety.

BACKGROUND OF THE INVENTION

Optical coherence analysis relies on the use of the interference phenomena between a reference wave and an experimental wave or between two parts of an experimental wave to measure distances and thicknesses, and calculate indices of refraction of a sample. Optical Coherence Tomography (OCT) is one example technology that is used to perform high-resolution cross sectional imaging. It is often applied to imaging biological tissue structures, for example, on microscopic scales in real time. Optical waves are reflected from an object or sample and a computer produces images of cross sections or three-dimensional volume renderings of the sample by using information on how the waves are changed upon reflection.

There are a number of different classes of OCT, but Fourier domain OCT currently offers the best performance for many applications. Moreover, of the Fourier domain approaches, swept-source OCT has distinct advantages over techniques such as spectrum-encoded OCT because it has the capability of balanced and polarization diversity detection. It also has advantages for imaging in wavelength regions where inexpensive and fast detector arrays, which are typically required for spectrum-encoded OCT, are not available.

In swept source OCT, the spectral components are not encoded by spatial separation, but they are encoded in time. The spectrum is either filtered or generated in successive optical frequency sampling intervals and reconstructed before Fourier-transformation. Using the frequency scanning swept source, the optical configuration becomes less complex but the critical performance characteristics now reside in the source and especially its frequency sweep rate and tuning accuracy.

High speed frequency tuning, or high sweep rates, for OCT swept sources is especially relevant to in-vivo imaging where fast imaging reduces motion-induced artifacts and reduces the length of the patient procedure. It can also be used to improve resolution.

Historically, microelectromechanical systems (MEMS)-tunable vertical-cavity surface-emitting lasers (VCSELs) have been used in telecommunications applications. Their tunability enabled a single laser to cover multiple channels of the ITU wavelength division multiplexing grid.

More recently, these MEMS tunable VCSELs have been proposed as the swept sources in swept source OCT systems. Here, they have a number of advantages. Their short optical cavity lengths combined with the low mass of their deflectable MEMS membrane mirrors enable high sweep speeds. Moreover, they are capable of single longitudinal mode operation and are not necessarily subject to mode hopping noise. These characteristics also contribute to long coherence lengths for deep imaging.

In one example, a MEMS tunable VCSEL uses an indium phosphide (InP)-based quantum-well active region with a bonded gallium arsenide (GaAs)-based oxidized mirror. An electrostatically actuated dielectric mirror is suspended over the active region and separated by an air gap that forms part of the electrostatic cavity for the dielectric mirror. The mirror is monolithically fabricated on top of the active region. The device is optically pumped by a 980 nanometer (nm) laser.

SUMMARY OF THE INVENTION

Monolithically forming the MEMS electrostatically actuated dielectric mirror over the active region creates a number of disadvantages, however. First, any processes required to form MEMS mirror must be compatible with the chemistry of the active region. Moreover, there is an overlap between the optical cavity that extends between the active region and the MEMS mirror and the electrostatic cavity of that MEMS mirror. This requires trade-offs between the optimal electrostatic cavity, which is preferably small to minimize drive voltage, and the air portion of the optical cavity, which is preferably large to maximize tunability.

Another problem is that since the optical cavity and the electrostatic cavity overlap at least to some degree, the MEMS mirror is tuned by pulling the mirror toward the active region. If too much voltage is applied, this mirror will then snap down and possibly adhere to the active region destroying or damaging the MEMS tunable VCSEL.

The present invention is similarly directed to a MEMS tunable VCSEL. The difference is that the MEMS mirror is a bonded to the active region. This allows for a separate electrostatic cavity, that is outside the laser's optical resonant cavity. Moreover, the use of this cavity configuration allows the MEMS mirror to be tuned by pulling the mirror away from the active region. This reduces the risk of snap down. Moreover, since the MEMS mirror is now bonded to the active region, much wider latitude is available in the technologies that are used to fabricate the MEMS mirror.

In general, according to one aspect, the invention features a MEMS tunable VCSEL, comprising an active region substrate having active layers that amplify light and an optical membrane device that is attached to the active region substrate.

In embodiments, a spacer device is used that separates the active region substrate from the optical membrane device. Further, the active region substrate comprises a rear mirror, which can be a layer within the active region substrate or deposited in an optical port formed into the active region substrate. In one case, the rear mirror is a dichroic mirror that is reflective to the wavelengths of light amplified by the active region substrate and transmissive to wavelengths of light generated by a pump laser.

In a current example, the optical membrane device comprises a substrate layer, a device layer, in which a membrane is patterned, and intervening insulating layer. This insulating layer defines an electrostatic cavity. As a result, an optical membrane of the optical membrane device is deflected in a direction away from the active region substrate.

In general, according to another aspect, the invention features a method for fabricating a MEMS tunable VCSEL, comprising providing an active region substrate having active layers that amplify light and bonding an optical membrane device to the active region substrate.

In some embodiments, bonding the optical membrane device to the active region substrate comprises thermocompression bonding the optical membrane device to the active region substrate. In other examples, it comprises solder bonding the optical membrane device to the active region substrate.

In general, according to another aspect, the invention features an integrated VCSEL swept source system. This system comprises an optical bench and a MEMS tunable VCSEL installed on the optical bench that emits a swept optical signal that propagates parallel to a top surface of the optical bench.

In embodiments, a focusing lens is secured to the optical bench for coupling the swept optical signal into an optical fiber. A hermetic package contains the optical bench with a thermoelectric cooler preferably being installed between the optical bench and in the hermetic package to control a temperature of the optical bench.

In one example, a laser pump is installed on the optical bench for generating pump light for optically pumping an active layer within the MEMS tunable VCSEL. Preferably, an isolator is used between the laser pump and the MEMS tunable VCSEL for preventing back reflections into the laser pump. In different examples, the swept optical signal is taken from one side of the MEMS tunable VCSEL and the pump light is coupled into the other side of the MEMS tunable VCSEL or the swept optical signal is taken from the same side of the MEMS tunable VCSEL as the pump light is coupled into the MEMS tunable VCSEL.

In some embodiments, a semiconductor optical amplifier is installed on the optical bench that amplifies the swept optical signal. Typically, two isolators are located on either side of the semiconductor optical amplifier.

In an embodiment, the amplified swept optical signal from the semiconductor optical amplifier is returned to propagate through the MEMS tunable VCSEL. This can be accomplished with a polarization beam splitter.

In still other examples, the MEMS tunable VCSEL is electrically pumped.

In general, according to another aspect, the invention features an optical coherence analysis system, comprising: an interferometer that divides a swept optical signal between a reference arm and a sample arm and combines optical signals returning from the reference arm and the sample arm to generate an interference signal, a MEMS tunable VCSEL that generates the swept optical signal, the MEMS tunable VCSEL including an active region substrate having active layers that amplify light, and an optical membrane device that is attached to the active region substrate, and a detection system that detects the interference signal.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of and detailed approaches to implement the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the terms: includes, comprises, including and/or comprising, when used in this specification, specify the presence of stated features, elements, and/or components, but do not preclude the presence or addition of one or more other features, elements, components, and/or groups thereof. Further, it will be understood that when an element is referred to and/or shown as being connected or coupled to another element, it can be directly connected or coupled to the other element or intervening elements may be present.

Figure 1:
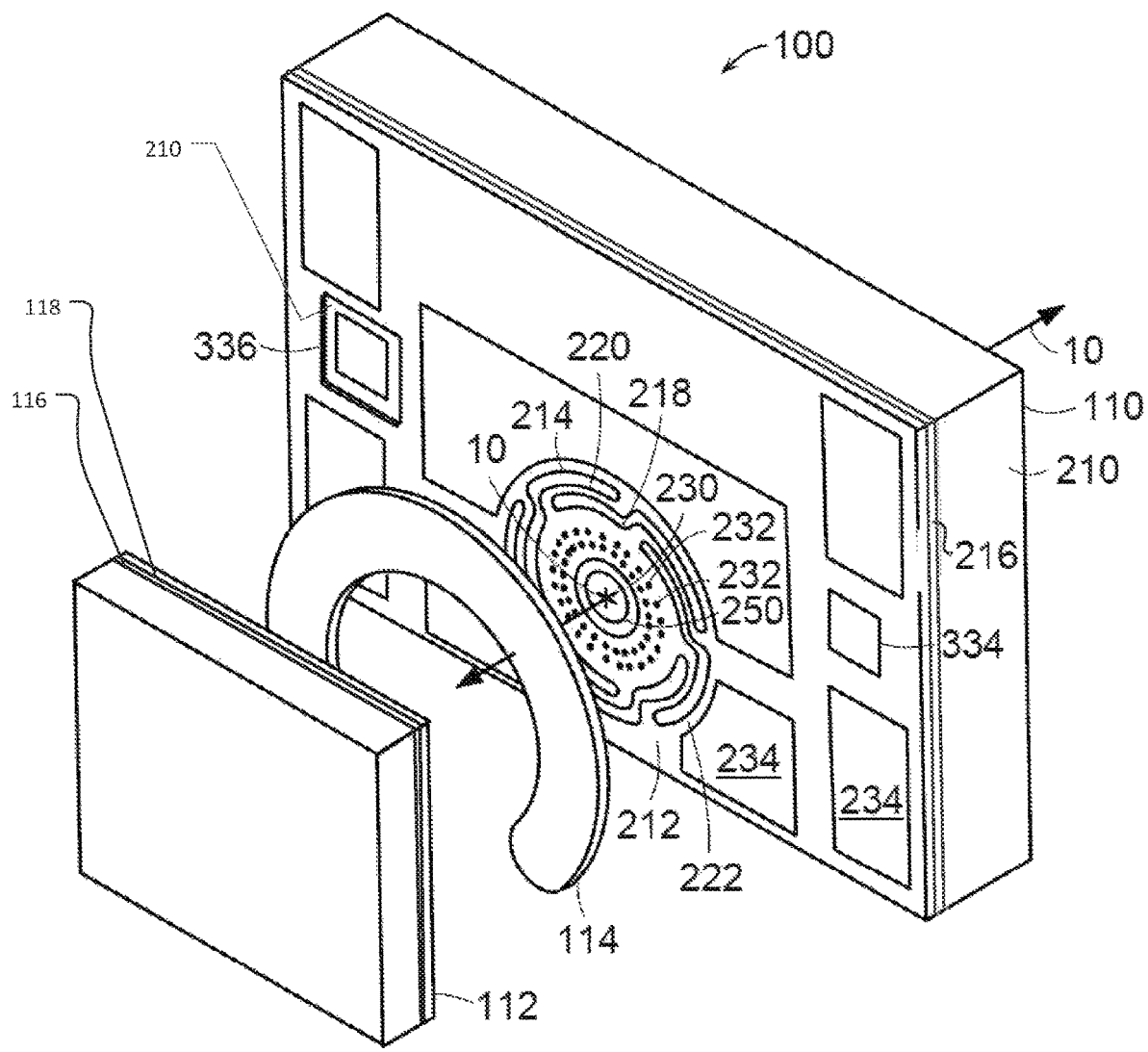
FIG. 1 is an exploded perspective view of a MEMS tunable VCSEL according to the present invention.

FIG. 1 shows a MEMS tunable VCSEL 100 comprising an optical membrane device 110 that is bonded to an active region substrate 112, which has been constructed according to the principles of the present invention.

Generally, in the MEMS tunable VCSEL 100, a spacer device 114 separates the active region substrate 112 from the membrane device 110 to thereby define its laser cavity. As a general rule, the thickness of the spacer device is about a micrometer thick. In some examples, the spacer is thicker than a micrometer to provide a longer air portion of the optical cavity. In other examples, it is less than a micrometer. Typically, the spacer device 114, active region substrate 112, and the membrane device 110 are bonded together using a metal bonding technique such as solder bonding or thermocompression bonding.

The optical membrane device 110 comprises handle material 210 that functions as a support. Preferably, the handle material is wafer material such as from a silicon handle wafer, which has been subsequently singulated into the illustrated device.

An optical membrane or device layer 212 is added to the handle wafer material 210. The membrane structure 214 is formed in this optical membrane layer 212. In the current implementation, the membrane layer 212 is silicon. An insulating layer 216 separates the optical membrane layer 212 from the handle wafer material 210.

During manufacture, the insulating layer 216 functions as a sacrificial/release layer, which is partially removed to release the membrane structure 214 from the handle wafer material 210. Currently, the membrane layer is manufactured from a silicon wafer that has been bonded to the insulating layer under elevated heat and pressure. During operation, the insulating layer provides electrical isolation between the device layer 212 and the handle material 210.

In the current embodiment, the membrane structure 214 comprises a body portion 218. The optical axis 10 of the device 100 passes concentrically through this body portion 218 and orthogonal to a plane defined by the membrane layer 212. A diameter of this body portion 218 is preferably 300 to 600 micrometers; currently it is about 500 micrometers.

Tethers 220 extend radially from the body portion 218 to an outer portion 222, which comprises the ring where the tethers 220 terminate. In the current embodiment, a spiral tether pattern is used.

An optically curved surface 250 is disposed on the membrane structure 214. This optically curved surface 250 forms an optically concave optical element to thereby form a curved mirror laser cavity in conjunction with the active region substrate 112, which currently includes is a flat mirror structure.

An optical coating dot 230 is typically deposited on the body portion 218 of the membrane structure 214, specifically covering the optically curved surface 250 of the optical element. The optical dot 230 is preferably a reflecting dielectric mirror stack. In some examples it is a dichroic mirror-filter that provides a defined reflectivity, such as between 1 and 10%, to the wavelengths of laser light generated in the laser 100, whereas the optical dot is transmissive to wavelengths of light that are used to optically pump the active layers in the active region substrate 112. In other examples, the optical dot is a reflective metal layer such as aluminum or gold.

In the illustrated embodiment, artifacts of the manufacture of the membrane structure 214 are etchant holes 232. These holes allow an etchant to pass through the body portion 218 of the membrane structure 214 to assist in the removal of the insulating layer 216 during the release process.

In the illustrated embodiment, metal pads 234 are deposited on the proximal side of the membrane device 210. These are used to solder or thermocompression bond, for example, the spacing structure 114 onto the proximal face of the membrane device 210.

This discrete spacing device 114 is avoided in other embodiments where the spacing structure 114 is formed to be integral with the membrane device 110 or active region substrate 112.

Bond pads 234 are also useful when installing the filter 100 on a micro-optical bench, for example.

Also provided is a membrane layer wire bond pad 334 that is used as an electrode for electrical connections to the membrane layer 212. A handle wafer wire bond pad 336 is used as the electrode for electrical connections to the handle wafer material 210. The membrane layer bond pad 334 is a wire bonding location for electrical control of the membrane layer 212. The handle wafer bond pad 336 is a wire bond pad for electrical access to the handle wafer material 210.

According to the invention, the active region substrate 112 comprises an active layer 118. This is preferably a single or multiple quantum well structure.

The material system of the active region substrate 112 is selected based on the desired spectral operating range. Common material systems are based on III-V semiconductor materials, including binary materials, such as GaN, GaAs, InP, GaSb, InAs, as well as ternary, quaternary, and pentenary alloys, such as InGaN, InAlGaN, InGaP, AlGaAs, InGaAs, GaInNAs, GaInNAsSb, AlInGaAs, InGaAsP, AlGaAsSb, AlGaInAsSb, AlAsSb, InGaSb, InAsSb, and InGaAsSb. Collectively, these material systems support operating wavelengths from about 400 nanometers (nm) to 2000 nm, including longer wavelength ranges extending into multiple micrometer wavelengths. Semiconductor quantum well and quantum dot gain regions are typically used to obtain especially wide gain and spectral emission bandwidths.

In the preferred embodiment, the polarization of the MEMS tunable VCSEL 100 is preferably controlled and at least stabilized. In general, this class of devices has a cylindrical resonator that emits linearly polarized light. Typically, the light is polarized along the crystal directions with one of those directions typically being stronger than the other. Moreover, the direction of polarization can change with laser current or pumping levels. The behaviors often exhibit hysteresis. In one embodiment, polarization selective mirrors are used. In another example, non-cylindrical resonators are used. In still a further embodiment, asymmetrical current injection is used when electrical pumping is used. In still other examples, the active region substrate includes trenches or materials layers that result in an asymmetric stress, strain, heat flux or optical energy distribution that are used in order to stabilize the polarization along a specified stable polarization axis.

Defining the other end of the laser cavity is the rear mirror 116 that is formed in the active region substrate 112. In one example, this is a layer within the active region substrate that creates the refractive index discontinuity that provides for a portion of the light to be reflected back into the cavity, such as between one and 10%. In other examples, the rear mirror 116 is a high reflecting layer that reflects over 90% of the light back into the laser cavity.

In still other examples, the rear mirror 116 is a dichroic mirror-filter that provides a defined reflectivity, such as between 1 and 10%, to the wavelengths of laser light generated in the laser 100, whereas the rear mirror 116 is transmissive to wavelengths of light that are used to optically pump the active layers in the active region substrate 112, thus allowing the active region substrate 112 to function as an input port of pump light.

Figure 2:
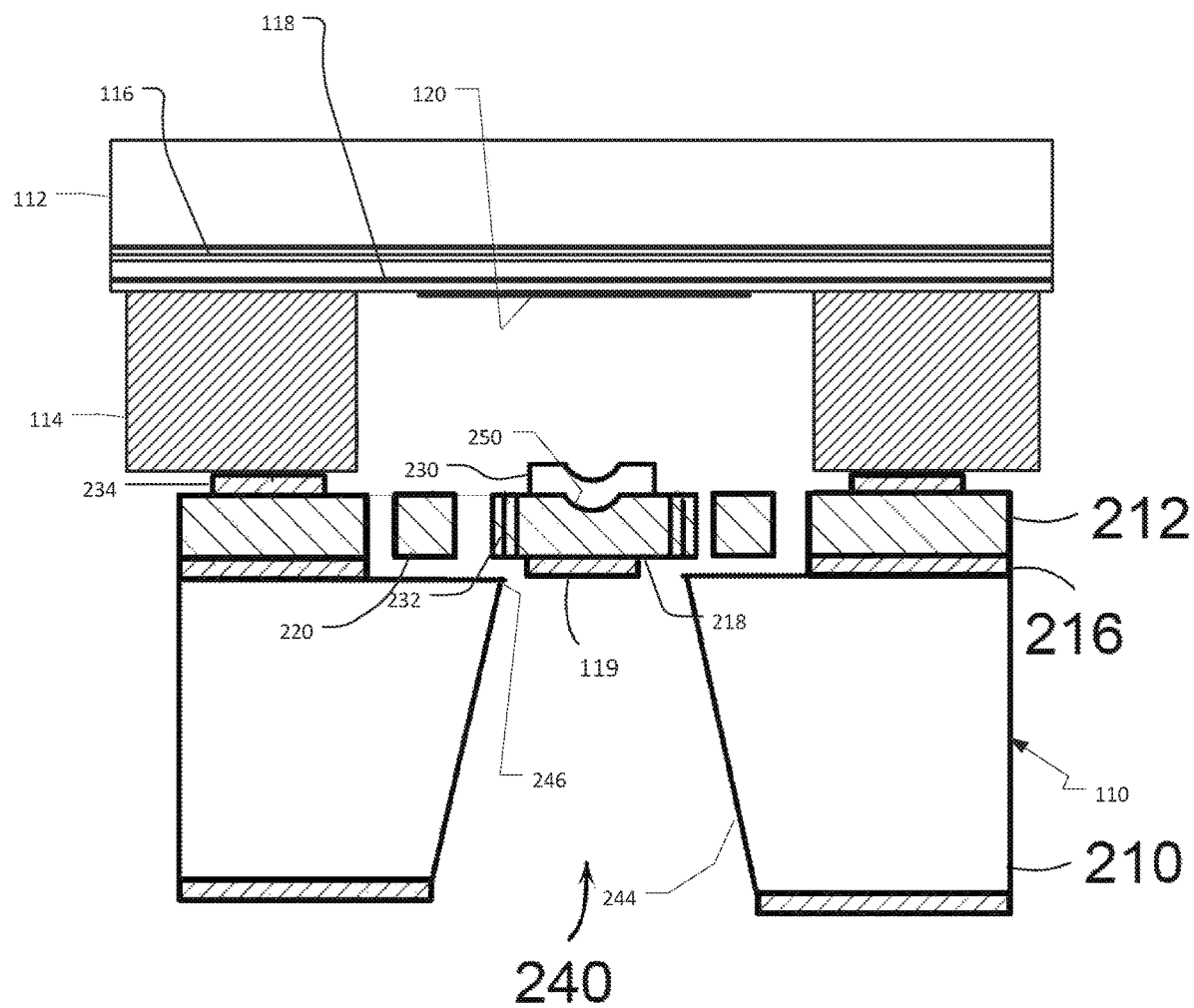
FIG. 2 is a cross sectional schematic view of the MEMS tunable VCSEL according to a first embodiment.

FIG. 2 schematically shows the MEMS tunable VCSEL 100 in cross-section.

An optical port 240 is provided, extending from a distal side of the handle wafer material 210 to the membrane structure 214 in cases where the reflector 230 is used as an output reflector or to provide for monitoring. If the reflector 230 is used as a back reflector, then the port 240 is not necessary in some cases.

Further, whether or not this optical port 240 is required also depends upon the transmissivity of the handle wafer material 210 at the optical wavelengths over which the MEMS tunable VCSEL 100 must operate. Typically, with no port, the handle wafer material 210 along the optical axis must be anti-reflection coated (AR) coated if transmission through the backside is required for functionality.

The optically concave surface 250 is formed either as a surface with a continuous curvature, a binary element, or a stepped curvature of a Fresnel structure.

The optical port 240 has generally inward sloping sidewalls 244 that end in the port opening 246. As a result, looking through the distal side of the handle wafer material, the body portion 218 of the membrane structure is observed. The port is preferably concentric with the optical coating 230 and the optical surface 250. Further, the backside of the body portion 218 is coated with an AR coating 119 in some examples. This AR coating is used to facilitate the coupling of pump light into the laser cavity and/or the coupling of laser light out of the cavity. In still other examples, it is reflective to pump light to return pump light back into the laser cavity.

The thickness of insulating layer 216 defines the electrostatic cavity length. Presently, the insulating layer is 216 is between 3.0 and 6.0 µm thick. It is a general rule of thumb, that electrostatic elements can be tuned over no greater than one third the distance of the electrostatic cavity. As result, the body portion 218, and thus the mirror optical coating 230 can be deflected between 1 and 3 µm, in one embodiment.

Figure 3:
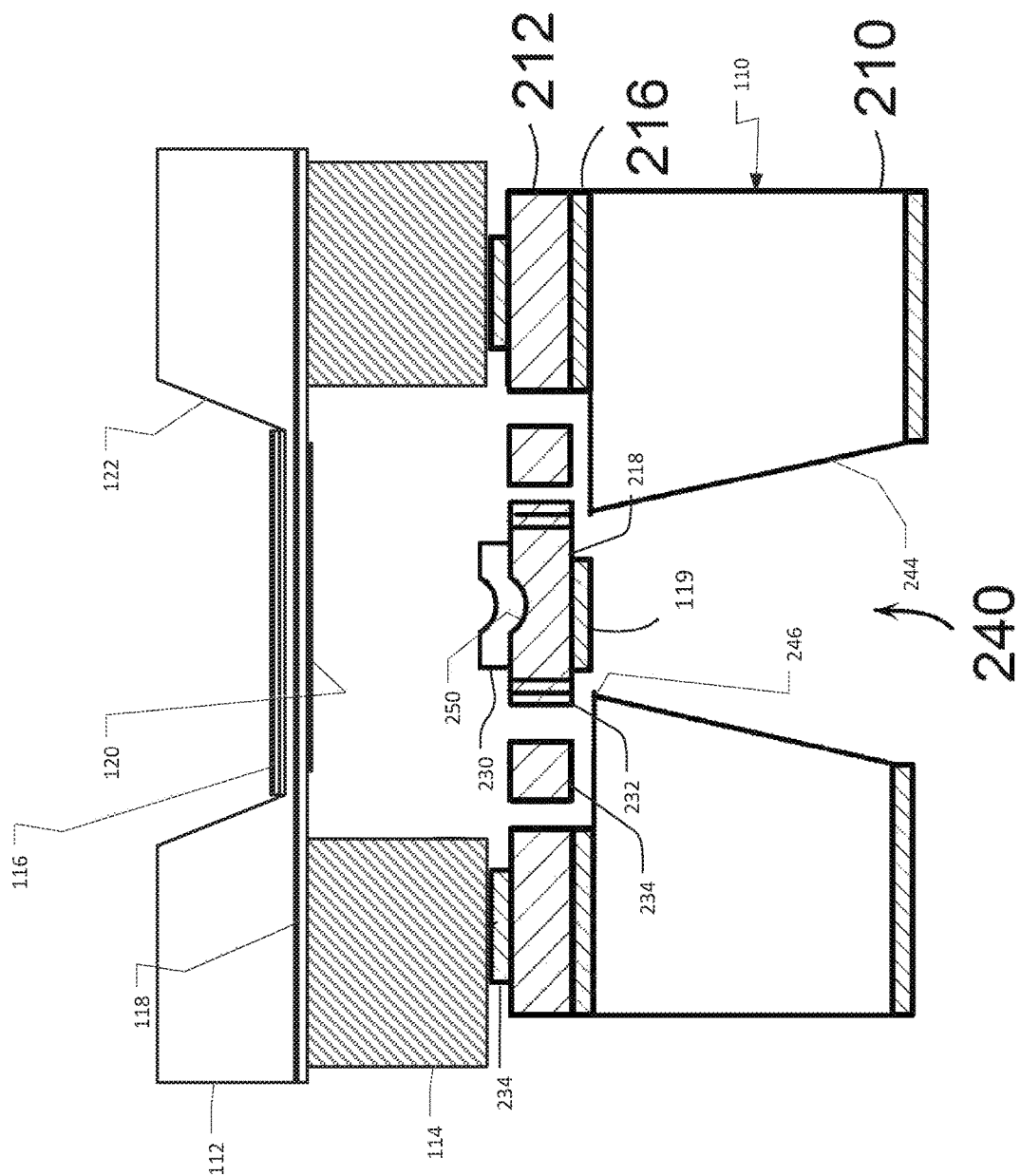
FIG. 3 is a cross sectional schematic view of the MEMS tunable VCSEL according to a second embodiment.

FIG. 3 schematically shows the MEMS tunable VCSEL 100 in cross-section according to another embodiment.

In this example, the rear mirror 116 that is formed in the active region substrate 112 is deposited at the bottom of rear optical port 122. This optical port is formed into the back side of the active region substrate 112. It is preferably formed with a flat bottom. This is achieved by etching through to an etch stop layer in the active region substrate 112.

The advantage of this embodiment is that the rear mirror 116 need not be formed within the active region substrate 112 as an integral material layer. Instead, the rear mirror 116 is deposited using standard thin-film deposition tools, in one implementation, or as a metal layer. The use of the optical port 122 has the advantage of locating the rear mirror 116 close to the active layer 118 and also close to the optical coating dot 230 that is typically deposited on the body portion 218 of the membrane structure 214. This has the effect of reducing the length of the laser optical cavity that extends between the rear mirror 116 and the optical coating dot 230. Such a short optical cavity increases the potential tuning speed of the laser 100 while also reducing or eliminating mode hopping noise.

Figure 4:
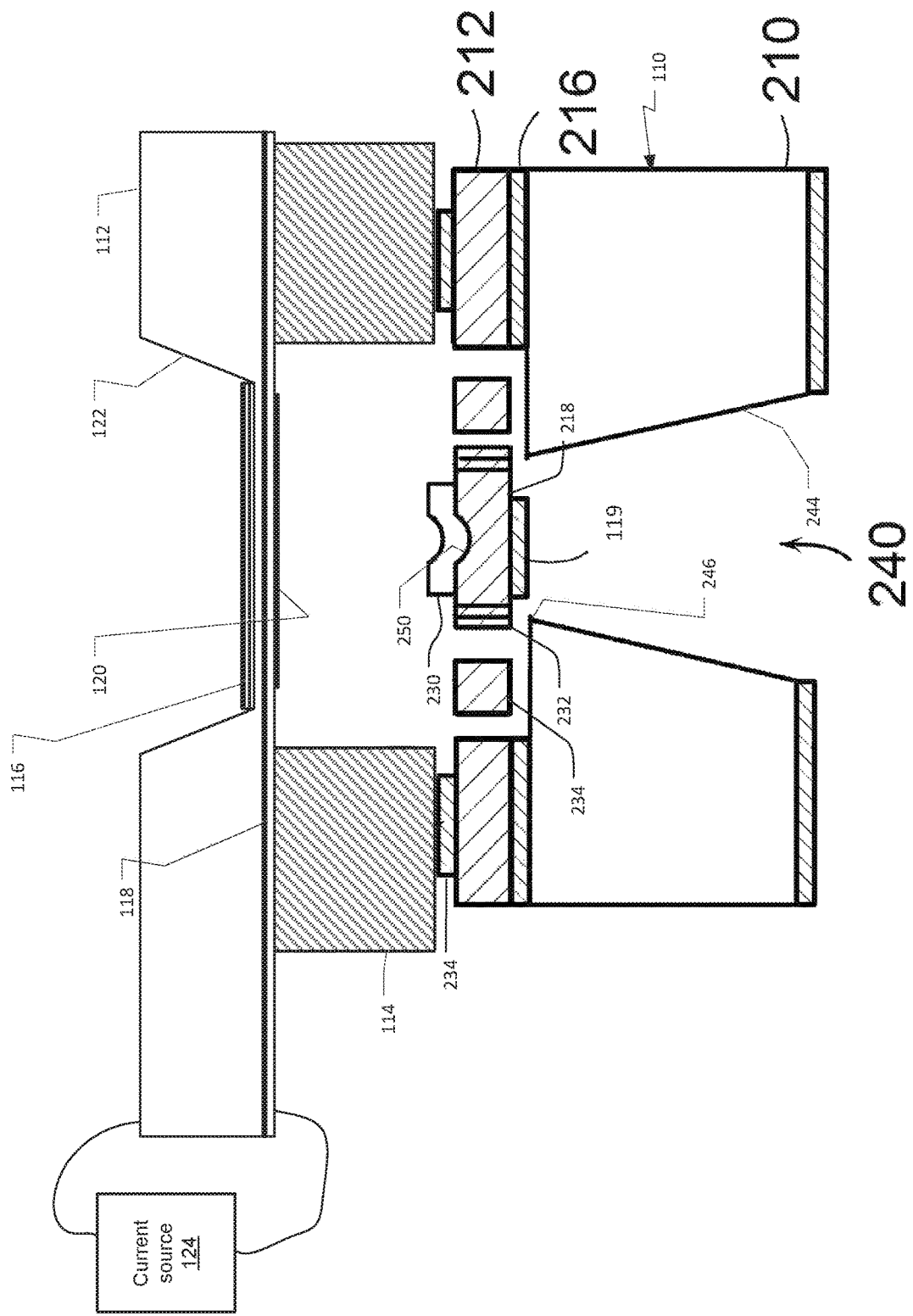
FIG. 4 is a cross sectional schematic view of the MEMS tunable VCSEL according to a third embodiment.

FIG. 4 schematically shows the MEMS tunable VCSEL 100 in cross-section according to another embodiment.

In this example, the rear mirror 116 again is formed in the active region substrate 112 and deposited at the bottom of rear optical port 122.

A current source 124 is used to electrically pump the active layer 118 in the active region substrate 112. Specifically, the current source 124 establishes a voltage across the active region 118. This embodiment avoids the need to optically pump the active region 118 and the concomitant increase in complexity associated with coupling the pump light into the laser cavity.

Figure 5:
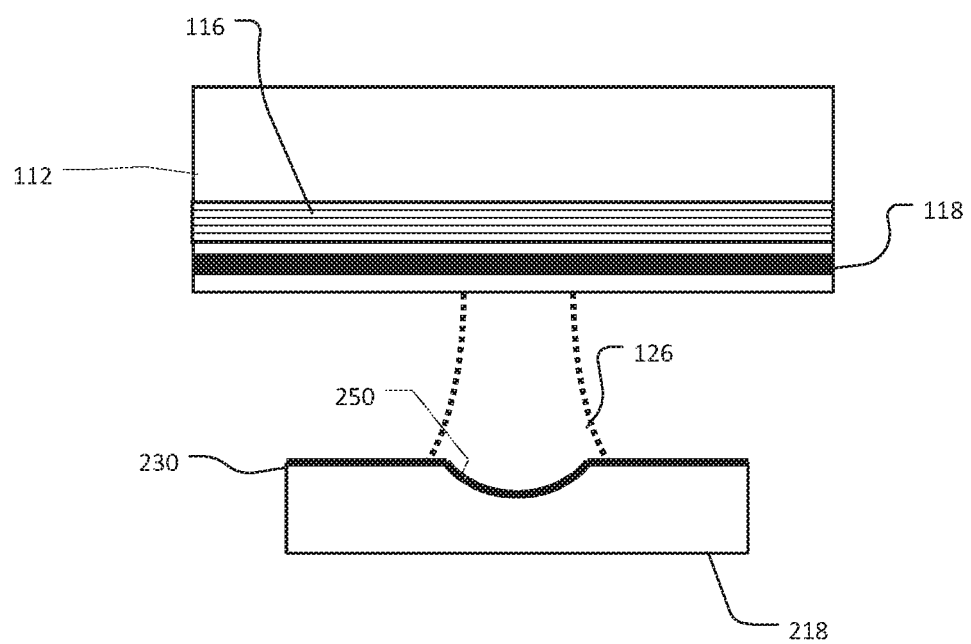
FIG. 5 is a cross sectional schematic view showing a laser cavity configuration using a K-mirror.

FIG. 5 shows a laser cavity configuration using a spatially limited or K-mirror optically curved surface 250.

In more detail, the optically curved surface 250, which is disposed on the body portion 218 of the membrane structure 214, is spatially limited to preferentially support the resonance of only the lower order optical spatial modes within the laser cavity. Specifically, in the illustrated embodiment, only the lowest order mode 126 fits within the extent of the curvature of the curved surface 250.

The basic operation of such resonators is generally disclosed in U.S. Pat. No. 7,327,772, which is incorporated herein by this reference in its entirety. Such resonators typically rely on the use of curved mirrors in which the spatial extent of the mirrors is limited to preferentially reflect only the desired modes, which is typically the only the lowest order spatial mode. Such mirrors are sometimes referred to as K-mirrors.

Figure 6:
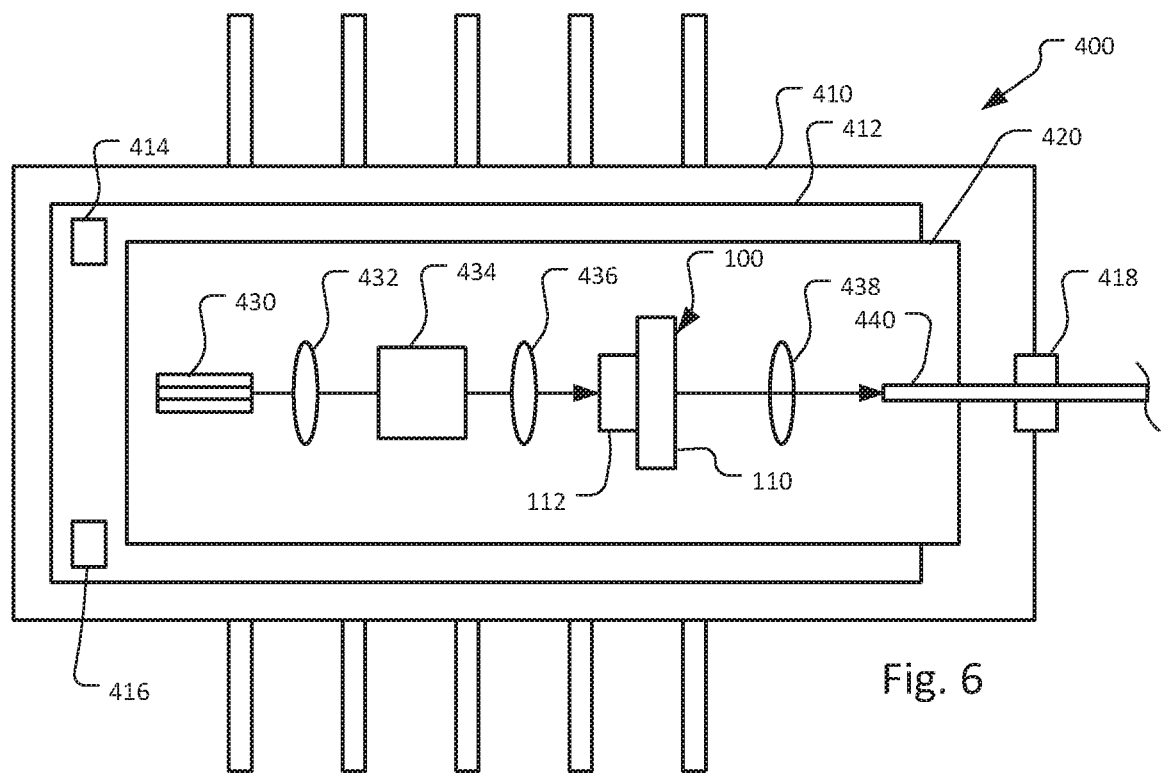
FIG. 6 is a top plan schematic view of a swept source using the MEMS tunable VCSEL that is pumped through the active region substrate and emits light through the membrane device.

FIG. 6 shows a swept source laser system 400 that incorporates the MEMS tunable VCSEL 100.

In general, the laser system 400 is contained within a butterfly package 410. The package 410 provides a hermetically sealed environment for the components of the laser system 400. Typically, a moisture getter is included in the package 410. Further, in some embodiments, the atmosphere in the hermetic package 410 is largely an inert gas such as helium or nitrogen. In other examples, a reactive component is included within the atmosphere that is sealed within the package 410. In one example, this reactive component is oxygen or ozone. The reason for this is described in more detail in US Pat. Publ. No. US 2012/0257210 A1, which is incorporated herein in its entirety by this reference. Briefly, the reactive element, such as oxygen chemically reacts with organics contained within the package to produce a gas such as carbon dioxide to thereby avoid package induced failure (PIF) that is otherwise caused by the deposition of these organics on hot optical facets of the laser.

In the preferred embodiment, the temperature of the laser system 400 is also controlled. This can be achieved through the use of a heater that heats the inside of the package 410 to a temperature above the ambient temperature. In the preferred embodiment, a thermoelectric cooler 412 is secured to the bottom of the butterfly package 410. The electric drive currents are provided to the thermoelectric cooler 412 via electrodes of 414 and 416.

A micro-optical bench 420 is secured to the top of the thermoelectric cooler 412. As result, the heat generated by active components such as pump lasers that are mounted to the optical bench 420 are removed from the package 410 via the thermoelectric cooler 412.

The optical components are mounted to the top side of the micro-optical bench 420. In particular, in this embodiment and the other illustrative embodiments, the optical components are installed on the optical bench 420 such that there optical axes are parallel to the planar top surface of the optical bench 420.

In more detail, in the illustrated embodiment, the MEMS tunable VCSEL 100 produces an output optical signal through the membrane device 110. Preferably, the MEMS tunable VCSEL 100 is directly, tombstone mounted, to the top of the bench 420. Particularly, the membrane device 110, for example, is mounted such that its membrane is orthogonal to the plane of the top surface of the bench 420. In a similar vein, the plane of the active layers 118 in the active region substrate 112 are also similarly perpendicular to the plane of the top surface of the bench 420.

As a result, the light exiting from the MEMS tunable VCSEL 100 propagates in a direction that is parallel to the top surface of the bench 420. It is collimated by output lens 438 that is mounted to the bench 420 and coupled into the fiber facet of the optical fiber 440 that is secured to the bench 420. This optical fiber passes through the side wall of the hermetic package 410 via a fiber feed through 418.

In the illustrated example, the MEMS tunable VCSEL 100 is optically pumped. Specifically, light at pump frequencies is generated by a laser chip 430 that is also mounted to the top of the bench 420. Sometimes the chip is mounted on a sub mount, which is in turn bonded to the bench 420. In one example, the laser pump chip 430 is operated at 980 nm. The pump light exiting from the laser chip is collimated by a first pump lens 432. The collimated light passes through an isolator 434. The light exiting from the isolator 434 is then focused via a second pump lens 436 into the active region substrate 112 of the MEMS tunable VCSEL 100. In the illustrated embodiment, the first pump lens 432, the isolator 434, and the second pump lens 436 are mounted to the bench 420.

Figure 7:
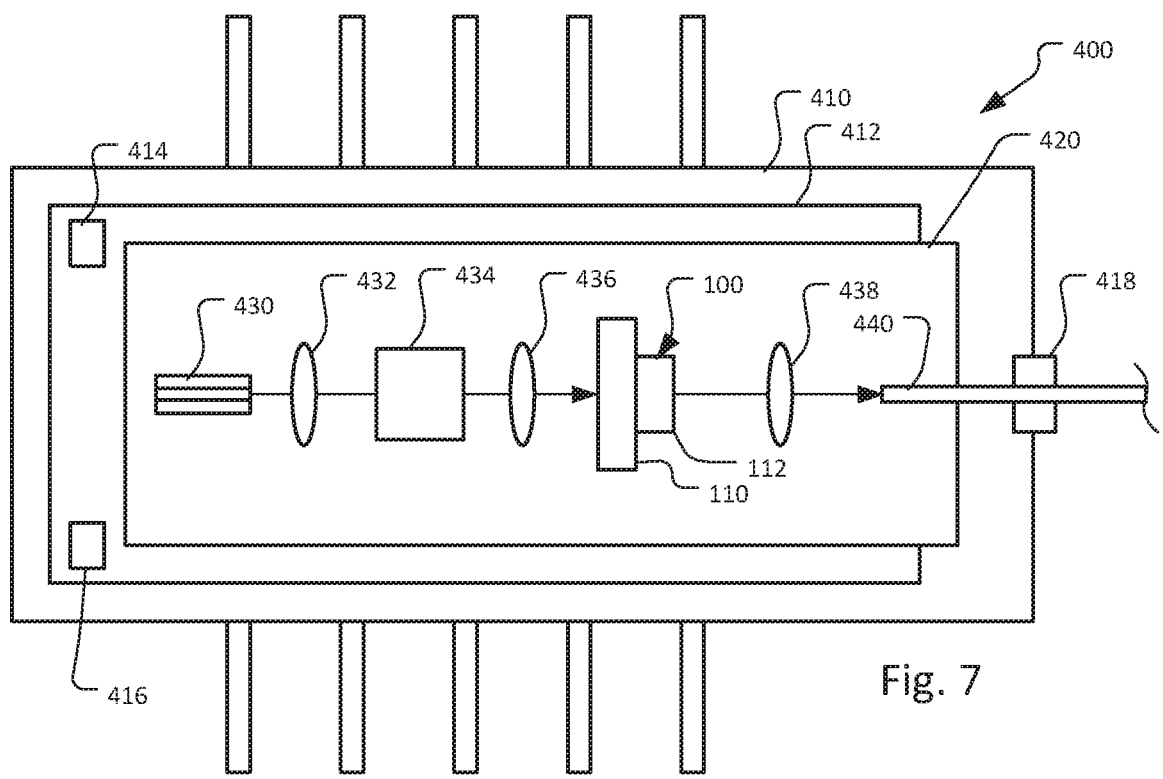
FIG. 7 is a top plan schematic view of a swept source using the MEMS tunable VCSEL that is pumped through the membrane device and emits light through the active region substrate.

FIG. 7 illustrates another embodiment of the laser system 400. This embodiment is largely similar to the embodiment illustrated and discussed with respect to FIG. 6. The difference is, however, in the orientation of the MEMS tunable VCSEL 100. The MEMS tunable VCSEL 100 produces an output optical signal through the active region substrate 112. This light from the MEMS tunable VCSEL 100 is similarly collimated by output lens 438 and coupled into the fiber facet of the optical fiber 440. The light exiting from the pump chip 430 is coupled into the MEMS tunable VCSEL 100 through the membrane device 110.

Figure 8:
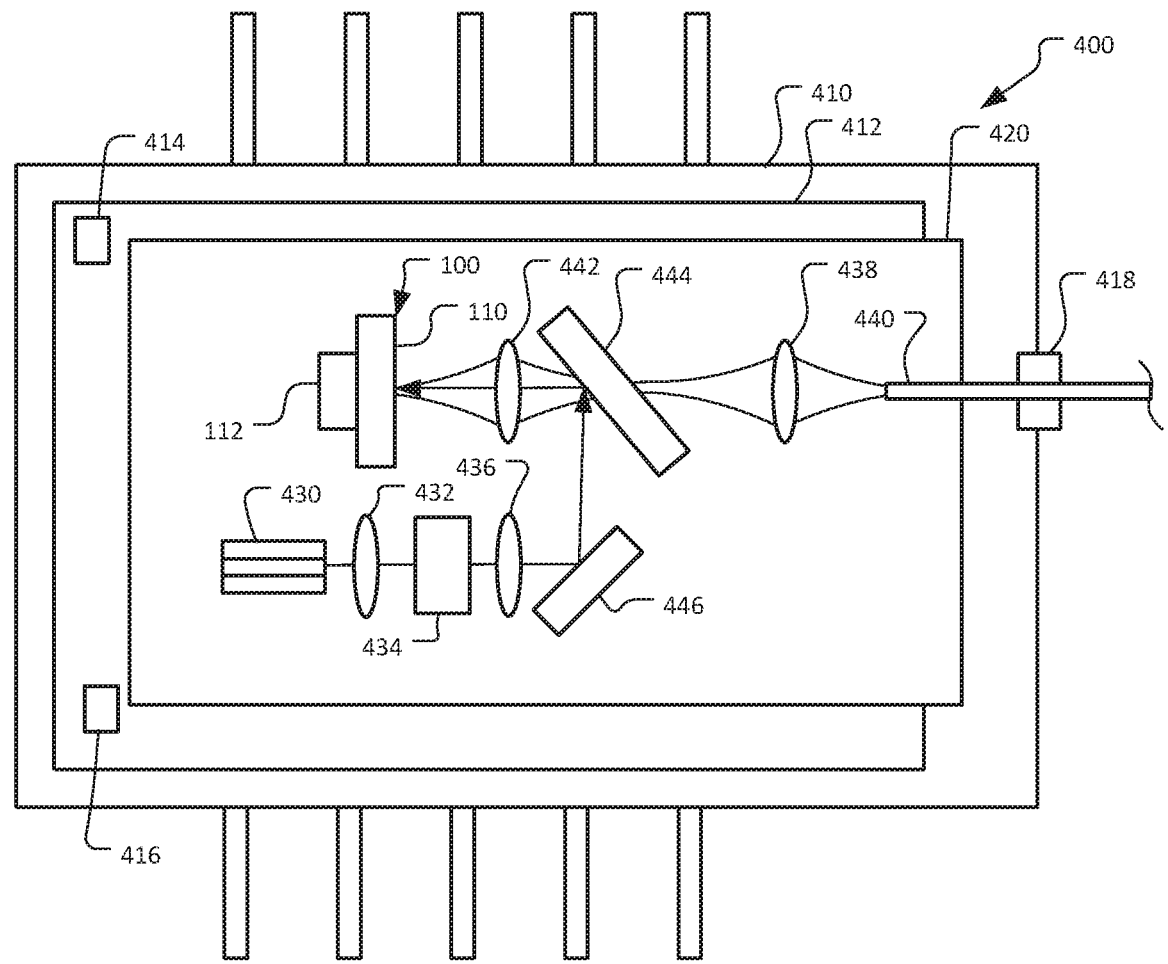
FIG. 8 is a top plan schematic view of a swept source using the MEMS tunable VCSEL that is pumped through the membrane device and emits light through the membrane device.

FIG. 8 illustrates another embodiment of the laser system 400. In the specific embodiment shown, the swept signal that is generated in the MEMS tunable VCSEL 100 is coupled out through the membrane device 110 and the light from the pump laser 430 is coupled in through the membrane device 110.

Certainly in alternative embodiment, the orientation of the MEMS tunable VCSEL 100 could be reversed with the light being coupled in and out through the active region substrate 112.

In either case, the light exiting from the MEMS tunable VCSEL 100 is collimated by a collimating lens 442 and then transmitted to the output lens 438 that couples the swept optical signal into the optical fiber 440.

The use of the two relay lenses 442, 438 collimates the pump light to be transmitted through a beam splitter/beam combiner element 444. In one example, the splitter/combiner element 444 is a polarization beam splitter. In other examples, it is a wavelength division multiplexing filter element. In either case, the splitter/combiner element 444 is transmissive to the light exiting from the MEMS tunable VCSEL 100 either due to its polarization, or its wavelength.

In contrast, the splitter/combiner element 444 is reflective to the light that is generated by the pump laser 430. As result, the light that is generated by the pump laser 430, collimated by the first pump lens 432 and collimated by the second pump lens 436, transmitted through the isolator 434, and redirected by fold mirror 446 is reflected by the splitter/combiner element 444 to be focused by the collimating lens 442 to be coupled into the MEMS tunable VCSEL 100.

Thus in this embodiment, the swept optical signal is taken from the MEMS tunable VCSEL 100 from the same side from which the MEMS tunable VCSEL 100 is optically pumped.

Figure 9:
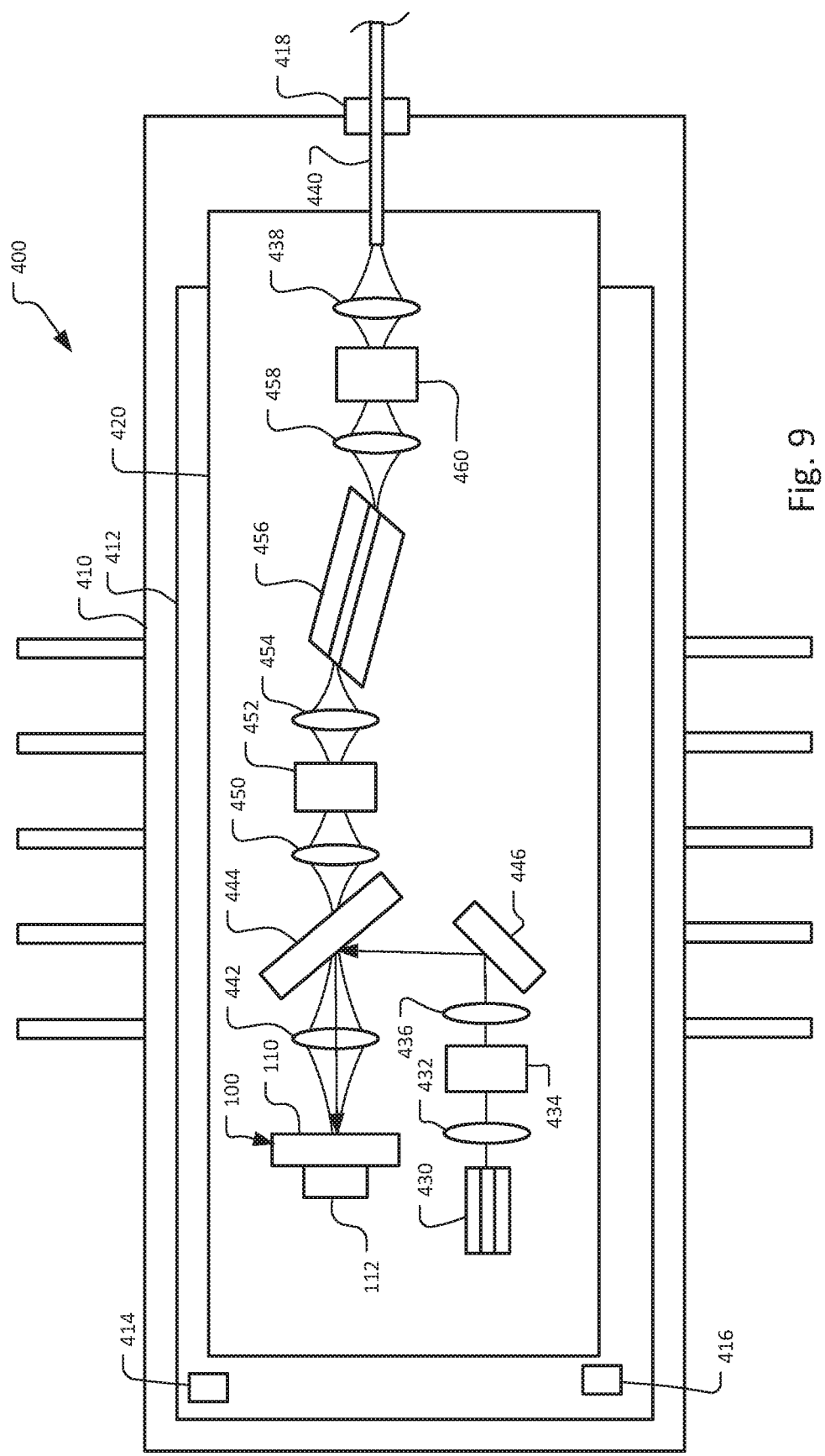
FIG. 9 is a top plan schematic view of a swept source using the MEMS tunable VCSEL with an integrated amplification stage.

FIG. 9 illustrates another embodiment of the laser system 400. This embodiment is similar to that shown in FIG. 8 in terms of how the swept optical signal is coupled out of the MEMS tunable VCSEL 100 and the manner in which the light from the pump laser 430 is coupled into it. This embodiment differs, however, in that it has an integrated amplification stage.

In more detail, the swept optical signal that is transmitted through the splitter/combiner element 444 is collimated by a first gain stage lens 450 to a first gain stage isolator 452. The light exiting from the first gain stage isolator 452 is then focused by a second gain stage lens 454 to be coupled into a semiconductor optical amplifier (SOA) 456.

This SOA 456 is installed on the top of the optical bench 420. Often, an intervening sub mount is used. The SOA 456 amplifies the swept optical signal generated by the MEMS tunable VCSEL 100 and the amplified signal is emitted through the output facet and collimated by a third gain stage lens 458. This collimates the amplified swept optical signal to pass through a second gain stage isolator 460. Finally, the output lens 438 couples the amplified swept optical signal into the output optical fiber 440.

Figure 10:
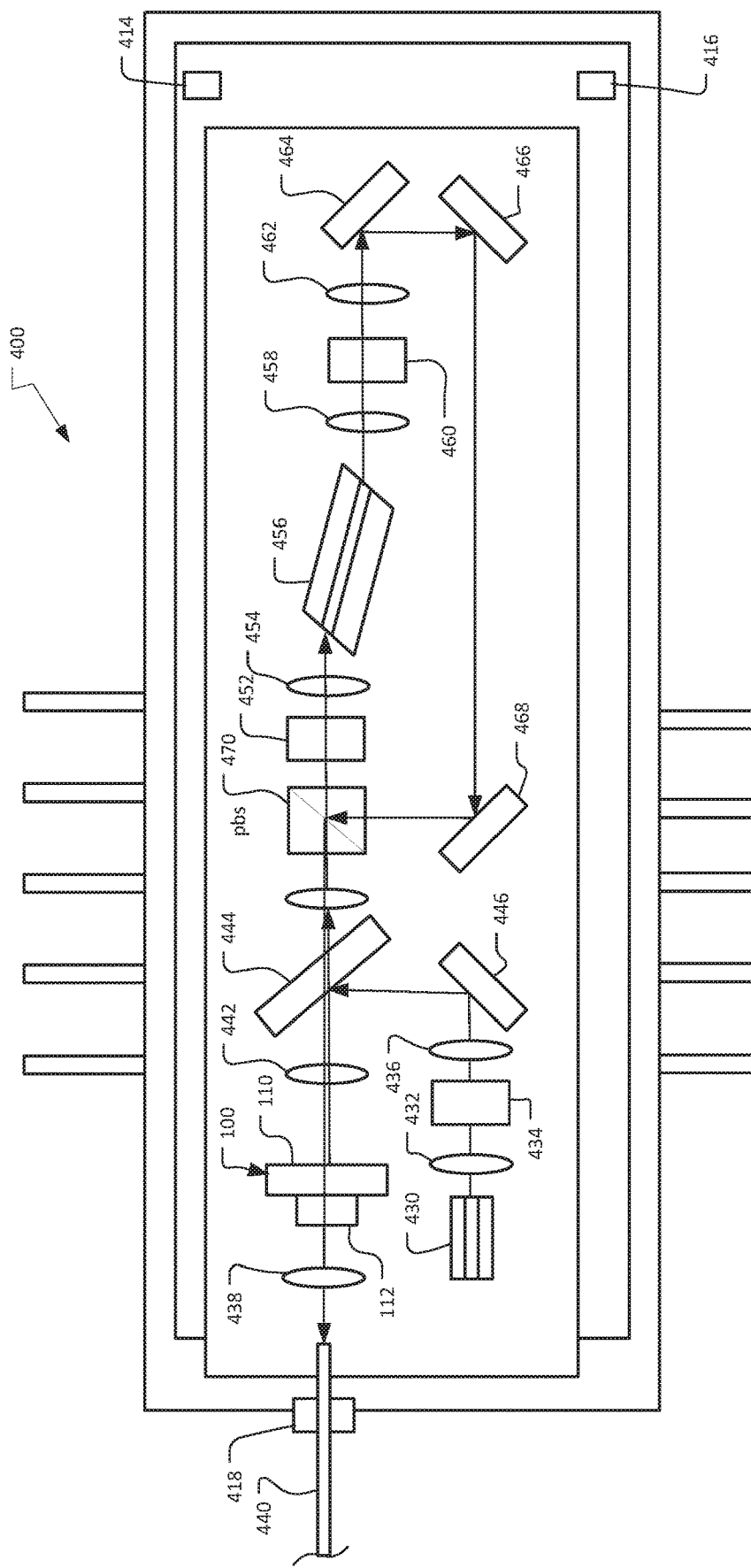
FIG. 10 is a top plan schematic view of a swept source using the MEMS tunable VCSEL with an integrated amplification stage and that uses the VCSEL in a self tracking configuration.

FIG. 10 illustrates another embodiment of the laser system 400 that similarly has an integrated amplification stage. This embodiment differs from the embodiment described with respect to FIG. 9 in that the MEMS tunable VCSEL 100 is implemented in a double pass, self-tracking configuration.

In more detail, the light that is transmitted through the splitter/combiner element 444, in addition to being coupled through the first gain stage isolator 452, is also transmitted through a polarization beam splitter 470. In the configuration illustrated, the polarization of light that is emitted by the MEMS tunable VCSEL 100 is transmitted directly through the polarization beam splitter 470.

Similar to the previous embodiment, this light is coupled into the SOA 456, and passes through the second gain stage isolator 460. The light then passes through a fourth gain stage lens 462 and is reflected by a series of fold mirrors 464, 466, and 468 to be coupled back to the polarization beam splitter 470.

The second gain stage isolator 460 in this embodiment further includes a half wave plate. This has the effect of rotating the polarization of the swept optical signal that was amplified by the SOA 456 by 90°. At this polarization, the light is reflected by the polarization beam splitter to be transmitted back to the MEMS tunable VCSEL 100. It is then coupled through the MEMS tunable VCSEL 100 and exits out through the active region substrate 112 to be collimated by the output lens 438 into the optical fiber 440.

This configuration helps to remove any amplified spontaneous emissions from the SOA 456 when the light is transmitted back through and filtered by the MEMS tunable VCSEL 100.

In one example, the MEMS tunable VCSEL lases in only one polarization to eliminate ASE from the second pass.

Figure 11:
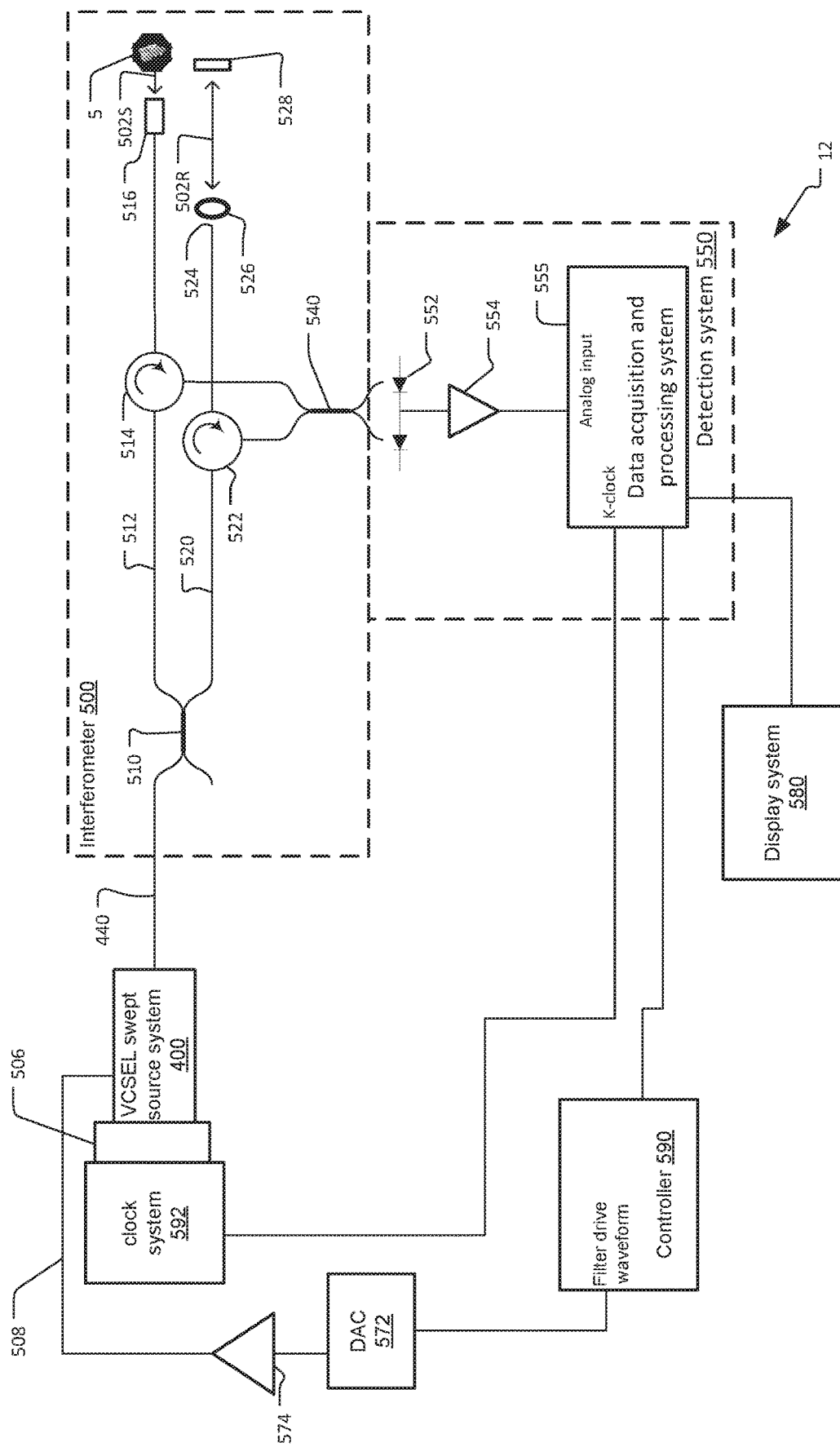
FIG. 11 is a schematic view of an OCT system incorporating the MEMS tunable VCSEL according to the present invention.

FIG. 11 shows an optical coherence analysis system 12, such as a tomography system, in which the MEMS tunable VCSEL 100 is used to generate the swept optical signal.

An optical swept source system 400 generates the tunable or swept optical signal on optical fiber 440 that is transmitted to interferometer 500. The swept optical signal scans over a scan band with a narrowband emission.

The swept source system 400 is generally intended for high speed tuning to generate swept optical signals that repeatedly scan over the scan band(s) at rates of greater than 1 kiloHertz (kHz). In current embodiments, the swept source system 400 tunes at speeds greater than 20 or 100 kHz. In very high speed embodiments, the multi-sweep rate swept source system 100 tunes at speeds greater than 200 or 500 kHz.

Typically, the width of the tuning or scan band is greater than 10 nanometers (nm). In the current embodiments, it is preferably between 50 and 150 nm, although even wider tuning bands are contemplated in some examples. On the other hand, the bandwidth of the narrowband emission has a full width half maximum (FWHM) bandwidth of less than 20 or 10 GigaHertz (GHz), and is usually 5 GHz or less. For optical coherence tomography, this high spectral resolution implies a long coherence length and therefore enables imaging deeper into samples, for example deeper than 5 millimeters (mm). On the other hand, in lower performance applications, for example OCT imaging less than 1 mm deep into samples, broader FWHM passbands are sometimes appropriate, such as passbands of about 200 GHz or less.

The tuning speed can also be expressed in wavelength per unit time. In one example, for an approximately 110 nm tuning band or scanband and 100 kHz scan rate, assuming 60% duty cycle for substantially linear up-tuning, the peak sweep speed would be 110 nm*100 kHz/0.60=18,300 nm/msec=18.3 nm/μsec or faster. In another example, for an approximately 90 nm tuning range and 50 kHz scan rate, assuming a 50% duty cycle for substantially linear up-tuning, the peak sweep speed is 90 nm*50 kHz/0.50=9,000 nm/msec=9.0 nm/μsec or faster. In a smaller tuning band example having an approximately 30 nm tuning range and 2 kHz scan rate, assuming a 80% duty cycle for substantially linear tuning, the peak sweep speed would be 30 nm*2 kHz/0.80=75 nm/msec=0.075 nm/μsec, or faster.

Thus, in terms of scan rates, in the preferred embodiments described herein, the sweep speeds are greater than 0.05 nm/μsec and preferably greater than 5 nm/μsec. In still higher speed applications, the scan rates are higher than 10 nm/μsec.

A controller 590 generates a filter, or tunable element, drive waveform or waveform that is supplied to a digital to analog converter (DAC) 572. This generates a tunable element drive signal 508 that is amplified by amplifier 574 and applied to the optical swept source system 400 as the electrostatic drive signal that is applied across the electrostatic cavity of the membrane substrate 110 via the membrane layer bond pad 334 and the handle wafer bond pad 336. In one example, the controller 590 stores the filter drive waveform that linearizes the frequency sweep of the swept source system 400.

A clock system 592 is used to generate k-clock signals at equally spaced optical frequency sampling intervals as the swept optical signal is tuned or swept over the scan or tuning band. A swept source signal splitter 506 is used to provide a portion of the swept source signal to the clock system 592.

In the illustrated example, a Mach-Zehnder-type interferometer 500 is used to analyze the optical signals from the sample 5. The swept optical signal from the optical swept source system 400 is transmitted on fiber 440 to a 90/10 optical fiber coupler 510 or other beam splitter, to give specific examples. The swept optical signal is divided between a reference arm 520 and a sample arm 512 of the system 12.

The optical fiber of the reference arm 520 terminates at the fiber endface 524. The light 502R exiting from the reference arm fiber endface 524 is collimated by a lens 526 and then reflected by a reference mirror 528 to return back, in some exemplary implementations.

The reference mirror 528 has an adjustable fiber to mirror distance, in one example. This distance determines the depth range being imaged, i.e. the position in the sample 5 of the zero path length difference between the reference arm 520 and the sample arm 512. The distance is adjusted for different sampling probes and/or imaged samples. Light returning from the reference mirror 528 is returned to a reference arm circulator 522 and directed to an interference signal combiner 540, such as a 50/50 fiber coupler. In other examples, such as those using free space optical configurations, the combiner 540 is a partially reflecting mirror/beam splitter.

The fiber on the sample arm 512 terminates at the sample arm probe 516. The exiting swept optical signal 502S is focused by the probe 516 onto the sample 5. Light returning from the sample 5 is returned to a sample arm circulator 514 and directed to the interference signal combiner 540.

The reference arm signal and the sample arm signal are combined or mixed in the interference signal combiner 540 to generate an interference signal.

The interference signal is detected by a detection system 550. Specifically, a balanced receiver, comprising two detectors 552, is located at each of the outputs of the fiber coupler 540 in the illustrated embodiment. The electronic interference signal from the balanced receiver 552 is amplified by amplifier 554, such as a transimpedance amplifier.

A data acquisition and processing system 555 of the detection system 550 is used to sample the interference signal output from the amplifier 554. The k-clock signals derived from the clock system 592 are used by the data acquisition and processing system 555 to synchronize system data acquisition with the frequency tuning of the optical swept source system 400. Specifically, the data acquisition and processing system 555 samples the interference signals in response to the k-clock signals to generate evenly spaced samples of the interference signal in the optical frequency domain.

A complete data set is collected of the sample 5 by spatially raster scanning the focused probe beam point over the sample 5 in a Cartesian geometry x-y fashion or a cylindrical geometry theta-z fashion. The spectral response at each one of these points is generated from the frequency tuning of the optical swept source system 400. Then, the data acquisition and processing system 555 performs a Fourier transform on the data in order to reconstruct the image and perform a 2D or 3D tomographic reconstruction of the sample 5. This transformed data is displayed by the display system 580.

In one application, the probe 516 is inserted into blood vessels and used to scan the inner walls of arteries and veins. In other examples, other analysis modalities are included in the probe such as intravascular ultrasound (IVUS), forward looking IVUS (FLIVUS), high-intensity focused ultrasound (HIFU), pressure sensing wires, and image guided therapeutic devices. In still other applications, the probe is used to scan different portions of an eye or tooth or other structure of a patient or animal.

While this invention has been particularly shown and described with references to preferred embodiments thereof, it will be understood by those skilled in the art that various changes in form and details may be made therein without departing from the scope of the invention encompassed by the appended claims.

What is claimed is:
1. An optical coherence analysis system, comprising:
an interferometer that divides a swept optical signal between a reference arm and a sample arm and combines optical signals returning from the reference arm and the sample arm to generate an interference signal;
a MEMS tunable VCSEL that generates the swept optical signal, the MEMS tunable VCSEL including an active region substrate having active layers that amplify light, and an optical membrane device that is attached to the active region substrate;

a detection system that detects the interference signal;

an optical bench on which the MEMS tunable VCSEL is installed, the MEMS tunable VCSEL emitting the swept optical signal, which propagates parallel to a top surface of the optical bench; and a laser pump installed on the optical bench for generating pump light for optically pumping the active layers of the MEMS tunable VCSEL.

2. The system as claimed in claim 1, further comprising a focusing lens secured to the optical bench for coupling the swept optical signal into an optical fiber for transmission to the interferometer.

3. The system as claimed in claim 1, further comprising a hermetic package containing the optical bench.

4. The system as claimed in claim 3, further comprising a thermoelectric cooler installed between the optical bench and in the hermetic package to control a temperature of the optical bench.

5. The system as claimed in claim 1, further comprising an isolator between the laser pump and the MEMS tunable VCSEL for preventing back reflections into the laser pump.

6. The system as claimed in claim 5, wherein the swept optical signal is taken from one side of the MEMS tunable VCSEL and the pump light is coupled into the other side of the MEMS tunable VCSEL.

7. The system as claimed in claim 5, wherein the swept optical signal is taken from the same side of the MEMS tunable VCSEL as the pump light is coupled into the MEMS tunable VCSEL.

8. The system as claimed in claim 1, further comprising a semiconductor optical amplifier that is installed on the optical bench that amplifies the swept optical signal.

9. The system as claimed in claim 8, further comprising:

an isolator between the MEMS tunable VCSEL and the semiconductor optical amplifier;

a first lens for coupling light from the MEMS tunable VCSEL into the isolator; and a second lens for coupling light from the isolator into the semiconductor optical amplifier.

10. The system as claimed in claim 8, further comprising two isolators on either side of the semiconductor optical amplifier.

11. The system as claimed in claim 8, wherein the amplified swept optical signal from the semiconductor optical amplifier is returned to propagate through the MEMS tunable VCSEL.

12. The system as claimed in claim 11, further comprising a polarization beam splitter for directing the amplified swept optical signal from the semiconductor optical amplifier to be coupled into the MEMS tunable VCSEL.

13. The system as claimed in claim 1, wherein the MEMS tunable VCSEL includes a spacer device that separates the active region substrate from the optical membrane device.

14. The system as claimed in claim 1, wherein the active region substrate further comprises optical port and a mirror at a bottom of the optical port.

15. The system as claimed in claim 14, when the mirror is a dichroic mirror.

16. The system as claimed in claim 1, wherein an optical membrane of the optical membrane device is deflected in a direction away from the active region substrate.

17. The system as claimed in claim 1, wherein an optical membrane of the optical membrane device includes a curved mirror structure.

* * * * *